(12) United States Patent
Banerjee et al.

(10) Patent No.: US 10,797,153 B2
(45) Date of Patent: Oct. 6, 2020

(54) PROCESS OF FORMING AN ELECTRONIC DEVICE INCLUDING AN ACCESS REGION

(71) Applicant: SEMICONDUCTOR COMPONENTS INDUSTRIES, LLC, Phoenix, AZ (US)

(72) Inventors: Abhishek Banerjee, Kruibeke (BE); Piet Vanmeerbeek, Sleidinge (BE); Peter Moens, Erwetegem (BE); Marnix Tack, Merelbeke (BE); Woochul Jeon, Phoenix, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/025,085

(22) Filed: Jul. 2, 2018

(65) Prior Publication Data

US 2020/0006521 A1   Jan. 2, 2020

(51) Int. Cl.
| | |
|---|---|
| *H01L 21/338* | (2006.01) |
| *H01L 29/66* | (2006.01) |
| *H01L 29/778* | (2006.01) |
| *H01L 29/205* | (2006.01) |
| *H01L 29/20* | (2006.01) |

(52) U.S. Cl.
CPC .... *H01L 29/66462* (2013.01); *H01L 29/2003* (2013.01); *H01L 29/205* (2013.01); *H01L 29/7787* (2013.01)

(58) Field of Classification Search
CPC .......... H01L 29/66462; H01L 29/2003; H01L 29/7787; H01L 29/205
See application file for complete search history.

(56) References Cited

U.S. PATENT DOCUMENTS

| | | | |
|---|---|---|---|
| 9,269,800 B2 | 2/2016 | Cheng | |
| 9,728,629 B1 * | 8/2017 | Banerjee | ............. H01L 29/7786 |

(Continued)

OTHER PUBLICATIONS

Watanabe et al.; "Design and Control of Interface Reaction Between Al-based Dielectrics and AlGaN Layer for Hysteresis-fee AlGaN/GaN MOS-HFETs"; Proc. of the 29th Int'l Syp. on Power Semiconductor Devices & ICs; IEEE (publisher);.2017; pp. 219-222.

(Continued)

*Primary Examiner* — Ismail A Muse
(74) *Attorney, Agent, or Firm* — Abel Schillinger, LLP

(57) ABSTRACT

A process of forming an electronic device can include forming a channel layer overlying a substrate and forming a barrier layer overlying the channel layer. In an embodiment, the process can further include forming a p-type semiconductor layer over the barrier layer, patterning the p-type semiconductor layer to define at least part of a gate electrode of a transistor structure, and forming an access region layer over the barrier layer. In another embodiment, the process can further include forming an etch-stop layer over the barrier layer, forming a sacrificial layer over the etch-stop layer, patterning the etch-stop and sacrificial layers to define a gate region, forming an access region layer over the barrier layer after patterning the etch-stop and sacrificial layers, and forming a p-type semiconductor layer within the gate region.

20 Claims, 8 Drawing Sheets

(56) References Cited

U.S. PATENT DOCUMENTS

| | | | | |
|---|---|---|---|---|
| 2010/0316342 | A1* | 12/2010 | Casey | B29D 11/00663 |
| | | | | 385/129 |
| 2012/0061727 | A1* | 3/2012 | Lee | H01L 29/2003 |
| | | | | 257/183 |
| 2012/0223320 | A1* | 9/2012 | Dora | H01L 29/1608 |
| | | | | 257/76 |
| 2013/0075751 | A1* | 3/2013 | Imanishi | H01L 29/7787 |
| | | | | 257/76 |
| 2013/0161641 | A1* | 6/2013 | Kub | H01L 29/0891 |
| | | | | 257/76 |
| 2013/0168739 | A1* | 7/2013 | Kiyama | H01L 29/778 |
| | | | | 257/194 |
| 2014/0097470 | A1* | 4/2014 | Kim | H01L 29/66462 |
| | | | | 257/194 |
| 2014/0159119 | A1* | 6/2014 | Derluyn | H01L 29/66462 |
| | | | | 257/194 |
| 2014/0252371 | A1 | 9/2014 | Kwak et al. | |
| 2015/0325679 | A1* | 11/2015 | Wong | H01L 29/66462 |
| | | | | 438/285 |
| 2016/0141404 | A1* | 5/2016 | Tsai | H01L 29/7787 |
| | | | | 257/76 |
| 2016/0254363 | A1* | 9/2016 | Suh | H01L 29/1066 |
| | | | | 438/172 |
| 2016/0351684 | A1* | 12/2016 | Chiu | H01L 23/291 |
| 2017/0133500 | A1* | 5/2017 | Etou | H01L 29/66462 |
| 2018/0204916 | A1* | 7/2018 | Shimizu | H01L 29/408 |
| 2018/0315844 | A1* | 11/2018 | Chen | H01L 29/267 |
| 2019/0157441 | A1* | 5/2019 | Yamada | H01L 29/7786 |

OTHER PUBLICATIONS

Shibata et al.; "1.7 kV / 1.0 mΩcm2 Normally-off Vertical GaN Transistor on GaN Substrate with Regrown p-GaN/AlGaN/GaN Semipolar Gate Structure"; International Electronic Device Meeting; IEEE (publisher); 2016; pp. IEDM16-248 to IEDM16-251.

Nishiyama et al.; "Recess Etching Process for AlGaN/GaN-HEMT Devices Using In-Situ Monitoring"; CS ManTech Conference; CS ManTech (publisher); 2014; pp. 389-392.

Okita et al.; "Through Recessed and Regrowth Gate Technology for Realizing Process Stability of GaN-GITs"; Proceedings of the 2016 28th International Symposium on Power Semiconductor Devices and ICs; IEEE (publisher); 2016; pp. 23-26.

U.S. Appl. No. 15/997,122, filed Jun. 4, 2018, specification and figures; Banerjee et al.; pp. 1-25.

\* cited by examiner

PROCESS OF FORMING AN ELECTRONIC DEVICE INCLUDING AN ACCESS REGION

FIELD OF THE DISCLOSURE

The present disclosure relates to processes of forming electronic devices, and more particularly to, processes of forming electronic devices including access regions.

RELATED ART

High electron mobility transistors can be enhancement-mode transistors. One type of such transistor can include a p-type GaN gate electrode. In-situ grown p-type GaN/AlGaN structures are relatively easy to grow; however, other complications make such structures difficult to implement. A high-precision etch tool is needed to achieve high etch selectivity p-type GaN/AlGaN etch. Typically, approximately 6 nm to 8 nm of AlGaN barrier layer is lost within the access regions. The AlGaN barrier layer can be thickened; however, the thicker layer, as initially deposited, can result in a lower threshold voltage. Post p-type etch surface passivation is an issue. Poor surface passivation enhances dynamic on-state resistance between the drain and source and lowers the device breakdown voltage. Further improvement of enhancement-mode high electron mobility transistors without the previously mentioned adverse complications is desired.

BRIEF DESCRIPTION OF THE DRAWINGS

Embodiments are illustrated by way of example and are not limited in the accompanying figures.

Figure 1:
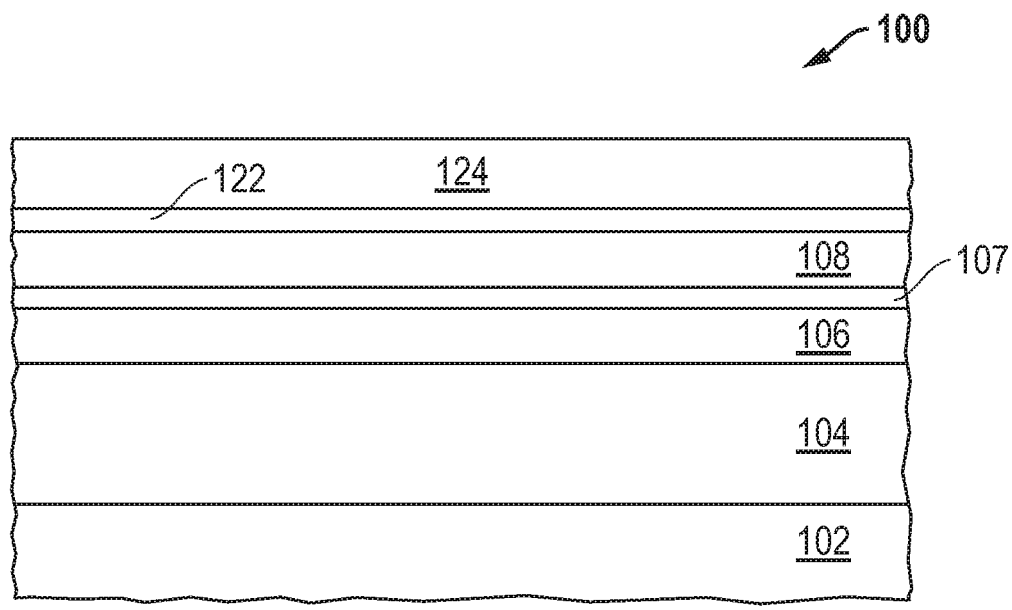
FIG. 1 includes an illustration of a cross-sectional view of a portion of a workpiece including a substrate and several layers.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 element and at least one Group 15 element. A III-N material is intended to mean a semiconductor material that includes at least one Group 13 element and nitrogen.

The term "semiconductor base material" refers to the principal material within a semiconductor substrate, region, or layer, and does not refer to any dopant within the semiconductor substrate, region, or layer. A boron-doped Si layer has Si as the semiconductor base material, and a C-doped GaN layer has GaN as the semiconductor base material.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a high electron mobility transistor (HEMT) that can be formed by a process that is more reproduceable and provides better control over the threshold voltage and on-state resistance ($R_{DSON}$) of the HEMT. The processes can help to form a relatively high quality crystal interface between a gate electrode and an underlying barrier layer. In some embodiments, the process can help to maintain a smoother interface between a barrier layer and subsequently grown layers and helps to maintain good carrier mobility under the gate electrode. In some embodiments, no regrowth of a threshold-voltage barrier is needed. More particularly, the threshold voltage of the HEMT can be determined in part by the barrier layer and not the access regions grown over the barrier layer underlying the gate electrode. Thus, the threshold voltage can be more uniform within the HEMT. The access region can be engineered with nearly any aluminum content and kept below a critical thickness so that a separate two-dimensional electrode gas (2DEG) is not formed between the barrier layer and the access region. Furthermore, a desired $R_{DSON}$ can be achieved by thickening the access region. The formation of the access region can be performed using a blanket deposition or a selective growth. The process flow can avoid processing steps that are complex or marginal (too little process margin to allow commercial production levels).

The HEMTs as described herein can be achieved without forming a recess in the channel layer within a gate region. Thus, the HEMT can have improved reliability as compared to a HEMT in which a recess in a channel layer is formed within the gate region. In a particular embodiment, a relatively low aluminum content may be used in the barrier layer under the gate electrode to improve the crystal quality at the interface between the gate electrode and its underlying barrier layer.

In an aspect, a process of forming an electronic device can include forming a channel layer overlying a substrate; forming a barrier layer overlying the channel layer; forming a p-type semiconductor layer over the barrier layer; patterning the p-type semiconductor layer to define at least part of a gate electrode of a transistor structure; and forming an access region layer over the barrier layer.

In another aspect, a process of forming an electronic device can include forming a channel layer overlying a substrate; forming a barrier layer overlying the channel layer; forming a sacrificial layer over the barrier layer; forming an etch-stop layer over the sacrificial layer; patterning the etch-stop and sacrificial layers to define a gate region; forming an access region layer over the barrier layer after patterning the etch-stop and sacrificial layers; and forming a p-type semiconductor layer within the gate region.

FIG. 1 includes a cross-sectional view of a portion of a workpiece 100 where a HEMT is being formed. The workpiece 100 can include a substrate 102, a buffer layer 104, a channel layer 106, a spacer layer 107, a barrier layer 108, an etch-stop layer 122 and a sacrificial layer 124. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, include $Al_aGa_{(1-a)}N$, where $0 \leq a \leq 1$. The composition of the buffer layer 104 may depend on the composition of the channel layer 106 and the designed operating voltage of the HEMT. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the buffer layer 104 near the substrate 102 can be 10 atomic % to 100 atomic % Al with the remainder Ga, and the cation content in the buffer layer 104 near the channel layer 106 can be 0 atomic % to 50 atomic % Al with the remainder Ga. In another embodiment, the buffer layer 104 can include a plurality of films. The buffer layer 104 can have a thickness in a range of approximately 1 micron to 10 microns.

The channel layer 106 can include a semiconductor base material, such as $Al_zGa_{(1-z)}N$, where $0 \leq z \leq 0.1$ and have a thickness in a range of approximately 20 nm to 4000 nm. In a particular embodiment, the channel layer 106 is a GaN layer (z=0). The channel layer 106 may be unintentionally doped or doped with an electron donor (n-type) dopant or an electron acceptor (p-type) dopant. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and, such carbon can result in unintentional doping. The carbon content may be controlled by controlling the deposition conditions, such as the deposition temperature and flow rates. In an embodiment, the channel layer 106 has a carrier impurity concentration that is greater than 0 and at most $1 \times 10^{14}$ atoms/cm$^3$, at most $1 \times 10^{15}$ atoms/cm$^3$, or at most $1 \times 10^{16}$ atoms/cm$^3$. In a particular embodiment, the carrier impurity concentration is in a range from $1 \times 10^{13}$ atoms/cm$^3$ to $1 \times 10^{16}$.

In an embodiment, the channel layer 106 has a thickness that is at least 50 nm. When the thickness is less than 50 nm, a 2DEG may be more difficult to generate, maintain, or both. In another embodiment, the channel layer 106 has a thickness that is at most 5000 nm. In a particular embodiment, the thickness in a range of 50 nm to 300 nm can provide a sufficiently thick channel layer 106 to allow for the proper generation and maintaining of the 2DEG and still obtain a reasonable on-state resistance ($R_{DSON}$).

The spacer layer 107 is optional. The spacer layer 107 can be an Al-containing layer that has higher Al content than the Al content of the barrier layer 108. For example, if the barrier layer 108 includes 10% Al based on the total cation content in the barrier layer 108, the spacer will be greater than 10% Al based on the total cation content in the spacer layer 107. The spacer layer 107 can have a thickness in a range from 0.5 nm to a 5 nm. If needed or desired, the spacer layer 107 can be thicker or thinner if needed or desired for a particular application.

The barrier layer 108 can include a III-V semiconductor material, such as a III-N semiconductor material. In a particular embodiment, the barrier layer can include $Al_bIn_cGa_{(1-b-c)}N$, wherein $0<b\leq1$ and $0\leq c\leq0.3$. The barrier layer 108 can include a single film or a plurality of films. When the barrier layer 108 includes a plurality of films, the aluminum content can remain substantially the same or increase as distance from the channel layer 106 increases. As the aluminum content in the barrier layer 108 increases, the thickness of the barrier layer 108 may be relatively thinner. In an embodiment, the barrier layer 108 has a thickness of at least 10 nm, and in another embodiment, the barrier layer 108 has a thickness of at most 150 nm. In a particular embodiment, the barrier layer 108 has a thickness in a range from 20 nm to 90 nm.

The etch-stop layer 122 can have a different composition as compared to the sacrificial layer 124 to provide better process margin when etching the sacrificial layer 124. A variety of materials may be used for each of the etch-stop and sacrificial layers 122 and 124. The use of III-V materials for the etch-stop and sacrificial layers 122 and 124 can help to maintain high quality crystallinity and the integrity of subsequently formed interfaces. In an embodiment, the etch-stop layer 122 can include a layer that includes $Al_dIn_eGa_{(1-d-e)}$, wherein $0\leq d\leq1$ and $0\leq e\leq0.3$, and the sacrificial layer 124 can include an unintentionally doped gallium nitride layer. In another embodiment, silicon nitride may be used for the sacrificial layer 124. The etch-stop layer 122 is thinner than the sacrificial layer 124. In an embodiment, the etch-stop layer 122 can have a thickness such that a continuous film is formed over the barrier layer 108. In another embodiment, the etch-stop layer 122 has a thickness in a range from 2 nm to 20 nm. In an embodiment, the sacrificial layer 124 can have a thickness in a range from 20 nm to 200 nm.

Figure 2:
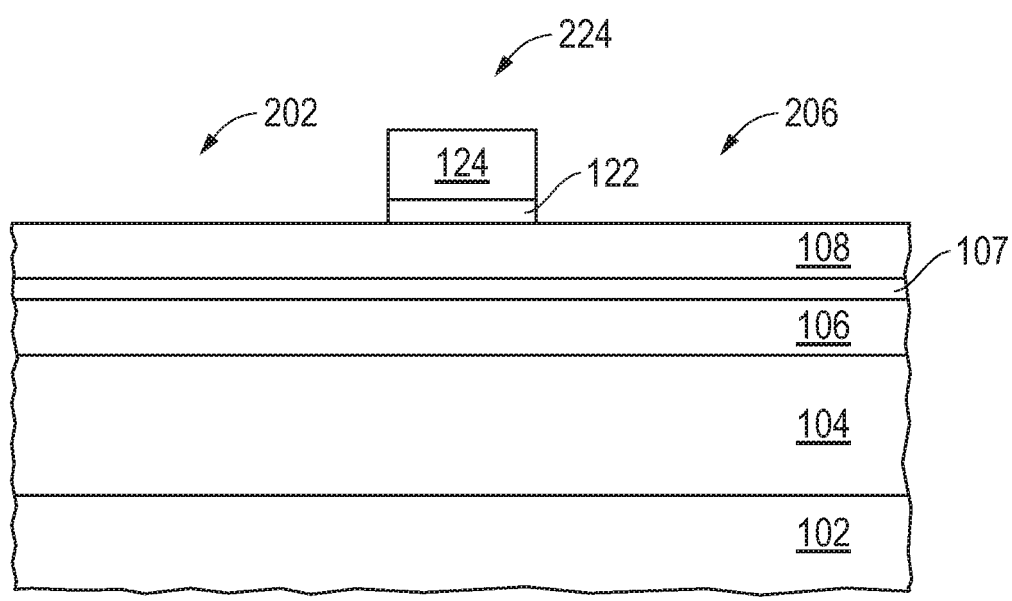
FIG. 2 includes an illustration of a cross-sectional view of the workpiece of FIG. 1 after patterning etch-stop and sacrificial layers.

In FIG. 2, the etch-stop and sacrificial layers 122 and 124 are patterned to remove the layers from source and drain regions 202 and 206, which are regions in which access regions and source and drain electrodes will be subsequently formed. Remaining portion of the layers 122 and 124 define a gate region, which is a region in which a gate electrode will be subsequently formed. The sacrificial layer 124 can be etched using a fluorine or oxygen chemistry. The fluorine chemistry may include $SF_6$, $NF_3$, $CHF_3$, or the like. When the dry etch reaches an underlying Al-containing layer, such as the barrier layer 108, $AlF_3$ forms along the surface of the barrier layer 108 and stops further etching. A dry etching including an oxygen chemistry can include a combination of Cl-containing and O-containing gases, such as $BCl_3$, HCl, $Cl_2$, or the like for the chlorine source, and $O_2$, $O_3$, $N_2O$, or the like for the oxygen source. When the dry etch reaches an underlying Al-containing layer, such as the barrier layer 108, $Al_2O_3$ forms along the surface of the barrier layer 108 and stops further etching.

The etch-stop layer 122 can be etched using a chlorine chemistry, such as $BCl_3$, HCl, $Cl_2$, or wet etched using a base, such as tetramethyl ammonium hydroxide $((CH_3)_4NOH$ or TMAH), KOH, NaOH, or the like. To reduce the amount of the barrier layer 108 removed when etching the etch-stop layer 122, the etch-stop layer 122 can have a significantly higher Al content as compared to the barrier layer 108. Furthermore, etch selectivity can be improved when using wet etching. Typically, as compared to dry etching, wet chemical etching has better selectivity to an underlying layer of a different material, such as the barrier layer 108, and will not cause plasma damage. Dry etches may be performed using endpoint detection, a timed etch, or a combination of endpoint detection and a timed overetch.

Figure 3:
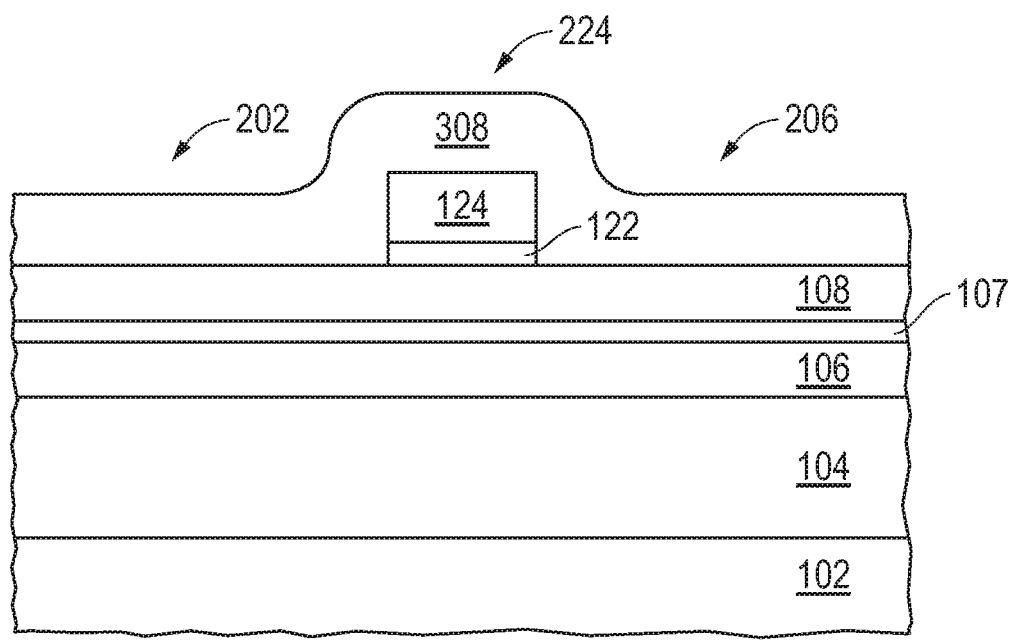
FIG. 3 includes an illustration of a cross-sectional view of the workpiece of FIG. 2 after forming an access region layer.

An access region layer 308 is formed along the exposed portions of the source and drain regions 202 and 206. In the embodiment as illustrated in FIG. 3, the access region layer 308 is blanket deposited over all of the workpiece, including portions of the layers 122 and 124. In another embodiment (not illustrated), the access region layer 308 may be selectively grown from the barrier layer 108. The access region layer 308 can include $Al_fIn_gGa_{(1-f-g)}N$, wherein $0<f\leq1$ and $0\leq g\leq0.3$. The access region layer 308 has an aluminum content that is the same or higher than the barrier layer 108. The access region layer 308 can include a single film or a plurality of films. When the access region layer 308 includes a plurality of films, the aluminum content can remain substantially the same or increase as distance from the channel layer 106 increases. As the aluminum content in the access region layer 308 increases, the thickness of the access region layer 308 may be relatively thinner. In an embodiment, the access region layer 308 has a thickness of at least 2 nm, and in another embodiment, the access region layer 308 has a thickness of at most 150 nm. In a particular embodiment, the access region layer 308 has a thickness in a range from 20 nm to 90 nm.

Figure 4:
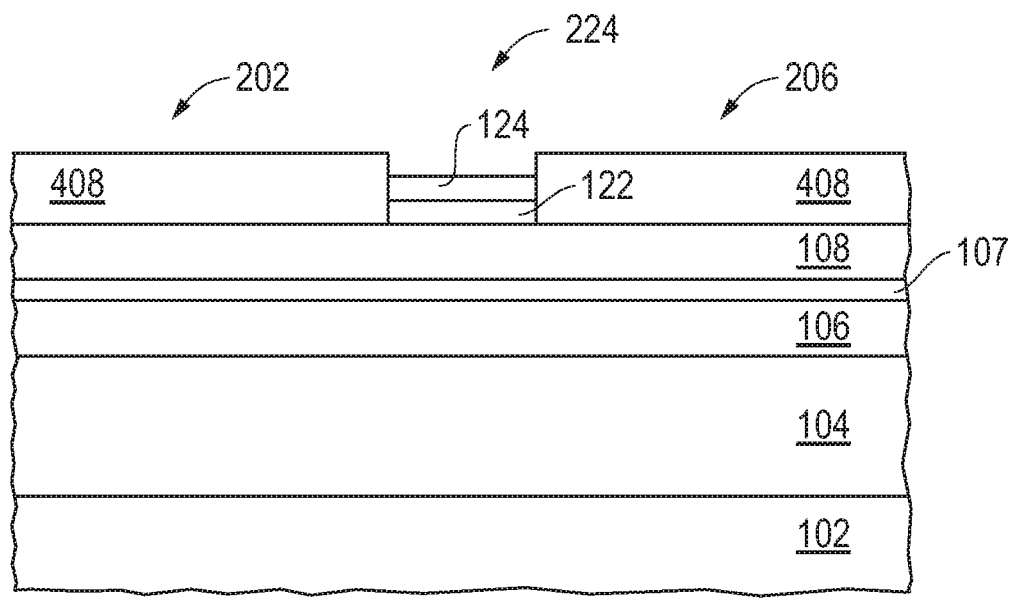
FIG. 4 includes an illustration of a cross-sectional view of the workpiece of FIG. 3 after removing portions of the access region layer and the sacrificial layer within a gate region.

When the access region layer 308 is blanket deposited, a portion of the access region layer 308 overlying the layers 122 and 124 is etched to form the access region 408 that covers the source and drain regions 202 and 206, as illustrated in FIG. 4. The access region layer 308 can be etched using a chlorine chemistry, such as $BCl_3$, HCl, $Cl_2$, or the like. The etch does not need to be optimized for selectivity to the sacrificial layer 124. Some of the sacrificial layer 124 can be etched within the gate region 224, as illustrated in FIG. 4. The etch can be performed as a timed etch. In another embodiment, the etch may be performed using endpoint detection with or without a timed overetch.

Figure 5:
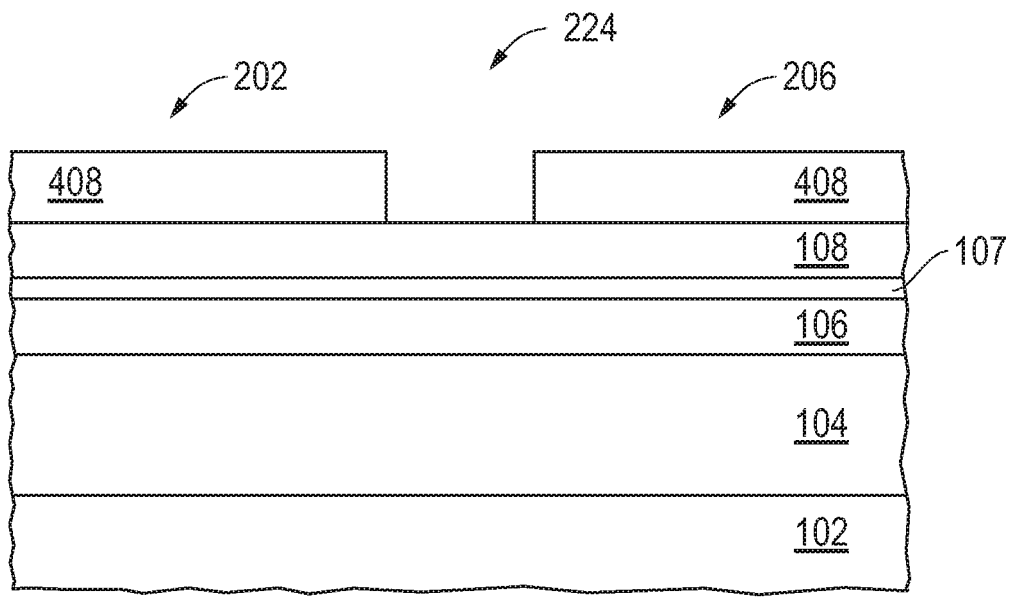
FIG. 5 includes an illustration of a cross-sectional view of the workpiece of FIG. 4 after removing remaining portions of the etch-stop and sacrificial layers.

Remaining portions of the layers 122 and 124 within the gate region 224 are removed as illustrated in FIG. 5. In an embodiment, the remaining portion of the sacrificial layer 124 can be removed using a dry etch having a fluorine chemistry, such as $SF_6$, $CHF_3$, $NF_3$, or the like. The etch-stop layer 122 can be etched with a chlorine chemistry, such as $BCl_3$, HCl, $Cl_2$, or the like, or wet etched using a base, such as TMAH, KOH, NaOH, or the like. Dry etches may be performed using endpoint detection, a timed etch, or a combination of endpoint detection and a timed overetch.

Figure 6:
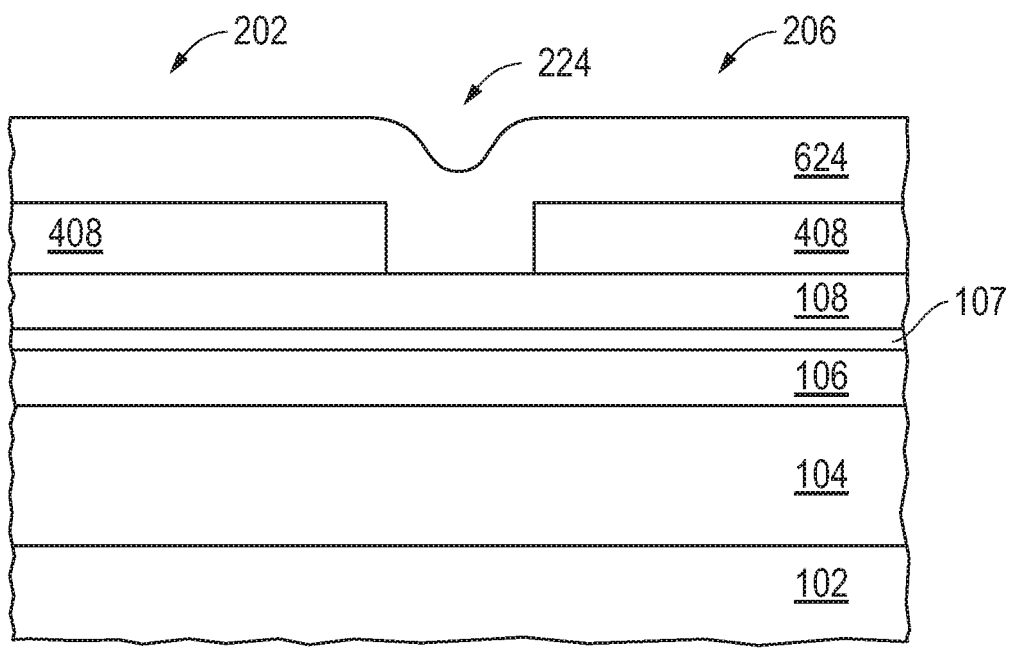
FIG. 6 includes an illustration of a cross-sectional view of the workpiece of FIG. 5 after forming a gate electrode layer.

A gate electrode layer 624 is deposited over the access region 408 and within the gate region 224, as illustrated in FIG. 6. In another embodiment, the gate electrode layer 624 can be selectively grown. The transistor structure being formed is an enhancement-mode HEMT. The gate electrode layer 624 can include a p-type semiconductor material. In a particular embodiment, the gate electrode layer can include p-type GaN. The p-type dopant can include Mg, Zn, Cd, or the like. The gate electrode layer 624 can have a thickness in a range from 10 nm to 300 nm. In another embodiment, the gate electrode layer 624 can be thicker, if needed or desired. In a further embodiment (not illustrated), a spacer layer may lie between the barrier layer 108 and the gate electrode layer 624. The spacer layer can have any of the compositions and thicknesses previously described with respect to the spacer layer 107.

Figure 7:
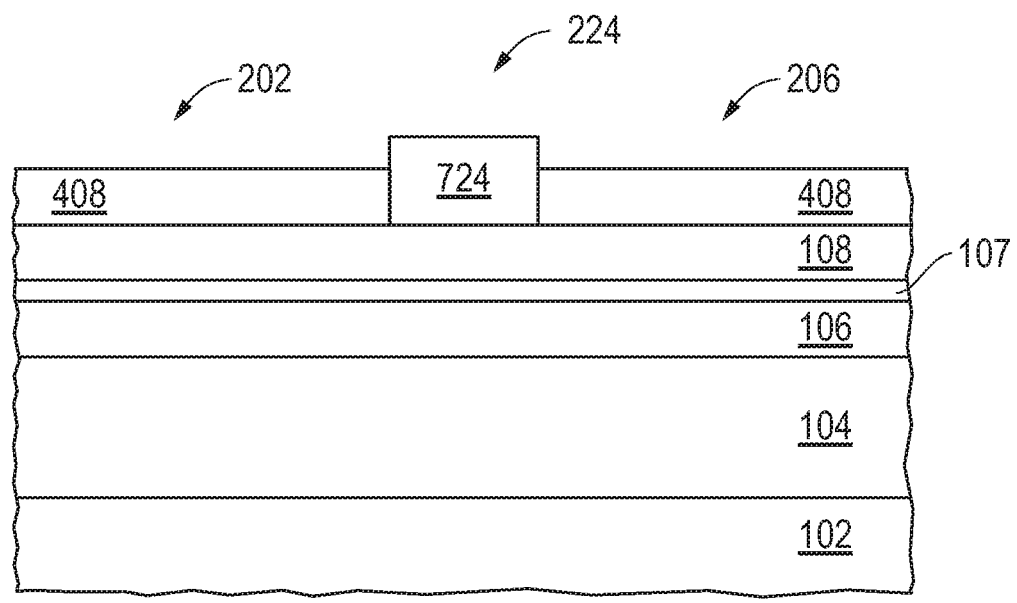
FIG. 7 includes an illustration of a cross-sectional view of the workpiece of FIG. 6 after patterning the gate electrode layer to define a gate electrode.

When the gate electrode layer 624 is blanket deposited, portions of the gate electrode layer 624 lying outside the gate region 224 can be removed to form a gate electrode 724, as illustrated in FIG. 7. The gate electrode layer 624 includes GaN, the gate electrode layer 624 can be etched using a fluorine or oxygen chemistry. The fluorine chemistry may include $SF_6$, $NF_3$, $CHF_3$, or the like. When the dry etch reaches an underlying Al-containing layer, such as the access region 408, $AlF_3$ forms along the surface of the access region 408 and stops further etching. A dry etching including an oxygen chemistry can include a combination of Cl-containing and O-containing gases, such as $BCl_3$, HCl, $Cl_2$, or the like for the chlorine source, and $O_2$, $O_3$, $N_2O$, or the like for the oxygen source. When the dry etch reaches an underlying Al-containing layer, such as the access region 408, $Al_2O_3$ forms along the surface of the access region 408 and stops further etching. In an embodiment, an upper surface of the gate electrode 724 may lie at a higher elevation as compared to the upper surface of the access region 408.

Figure 8:
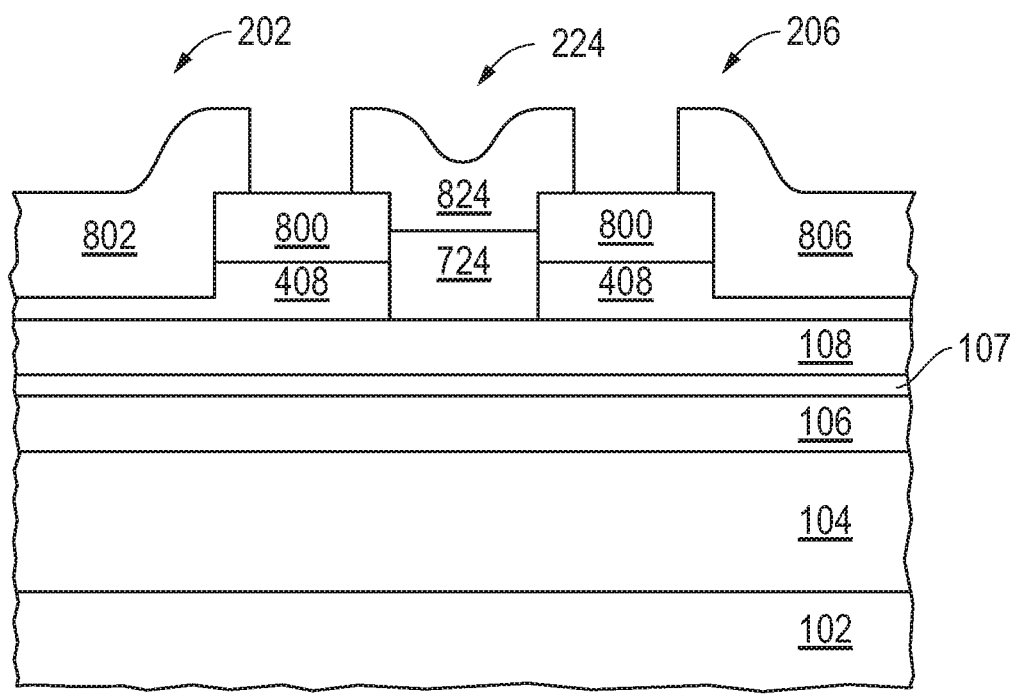
FIG. 8 includes an illustration of a cross-sectional view of the workpiece of FIG. 7 after forming source and drain electrodes and a gate interconnect.

In FIG. 8, an insulating layer 800 can be formed over the access region 408 and gate electrode 724. The insulating layer 800 can include an oxide, a nitride, or an oxynitride. The insulating layer 800 can have a thickness in a range of 50 nm to 500 nm. The insulating layer 800 can be patterned to define contact openings within the source and drain regions 202 and 206. In an embodiment, the contact openings can extend through the insulating layer 800 and part of, but not all, of the thickness of the access region 408. In another embodiment, the contact openings may not extend through any part of the thickness of the access region 408, and in another embodiment, the contact openings may extend through all of the access region 408. A gate contact opening extends through the insulating layer 800 to expose the gate electrode 724.

A conductive layer is formed over the insulating layer 800 and within the contact openings. The conductive layer can include a single film or a plurality of films. The conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt. % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to form a source electrode 802, a gate interconnect 824, and a drain electrode 806. In another embodiment, the gate interconnect 824 may be formed using a different interconnect level as compared to the source and drain electrodes 802 and 806.

The contact opening for the gate interconnect 824 and the contact openings for the source and drain electrodes 802 and 806 may be defined using the same process sequence or different process sequences. The gate interconnect 824 and the source and drain electrodes 802 and 806 may be formed using the same process sequence or different process sequences.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device, including an enhancement-mode HEMT, has been formed.

Figure 9:
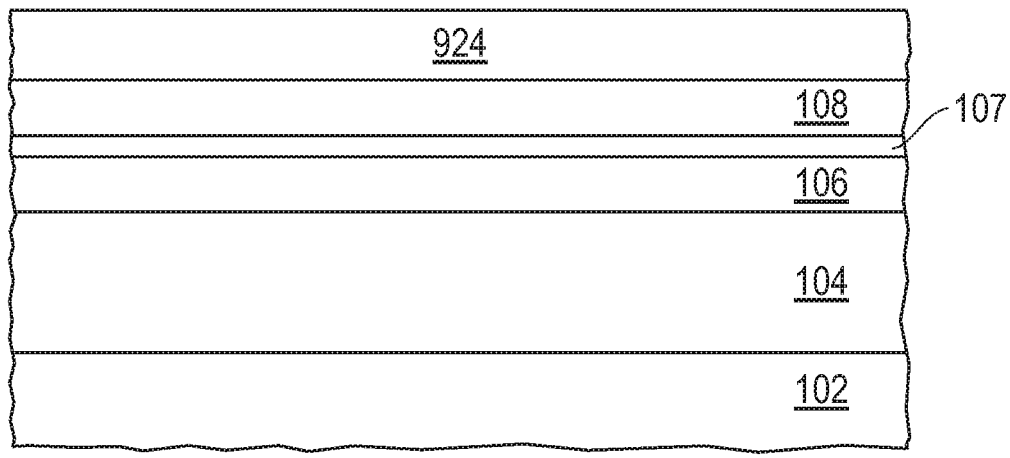
FIG. 9 includes an illustration of a cross-sectional view of a portion of another workpiece including a substrate and several layers.

In another set of embodiments, a gate electrode can be formed before forming an access region. FIG. 9 includes many layers that have been previously described with respect to another set of embodiments. A gate electrode layer 924 is formed over the barrier layer 108. The gate electrode layer 924 can include a p-type III-V semiconductor material. In a particular embodiment, the gate electrode layer can include p-type GaN. The p-type dopant can include Mg, Zn, Cd, or the like. The gate electrode layer 924 can have a thickness in a range from 10 nm to 300 nm. In another embodiment, the gate electrode layer 924 can be thicker, if needed or desired. In a further embodiment (not illustrated), a spacer layer may lie between the barrier layer 108 and the gate electrode layer 924. The spacer layer can have any of the compositions and thicknesses previously described with respect to the spacer layer 107.

Figure 10:
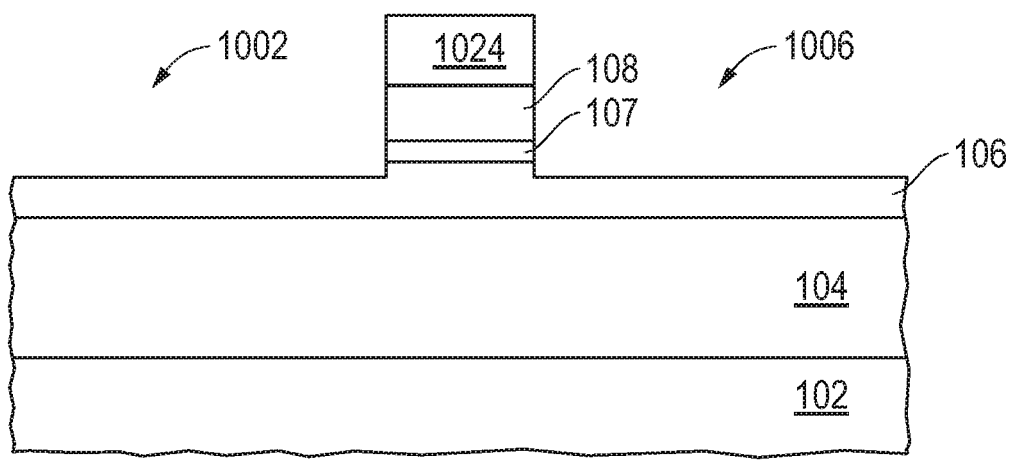
FIG. 10 includes an illustration of a cross-sectional view of the workpiece of FIG. 9 after patterning layers outside of a gate region.

A resist mask (not illustrated) can be formed over a gate region, and portions of the gate electrode layer 924 and layers 106, 107, and 108 are patterned, as illustrated in FIG. 10. The gate electrode layer 924 is patterned to form a gate electrode 1024. A source region 1002 is a location where a source electrode will be subsequently formed, and a drain region 1006 is a location where a drain electrode will be subsequently formed. The layers can be patterned by etching using techniques previously described with respect to the gate electrode layer 624 (with respect to the gate electrode layer 924), the sacrificial layer (124 with respect to the channel layer 106), and the spacer layer 107 (if present), and the barrier layer 108. In the embodiment as illustrated in FIG. 10, some, but not all, of the thickness of the channel layer 106 is etched. In an embodiment, in the areas outside of the gate region 1024, the thickness of the channel layer 106 removed is in a range from 1 nm to 5 nm. The removal of a portion of the thickness of the channel layer 106 ensures that the regrowth process starts on the channel layer 106 to achieve good crystal quality in subsequently grown semiconductor layers from the channel layer 106, as opposed to the barrier layer 108.

Figure 11:
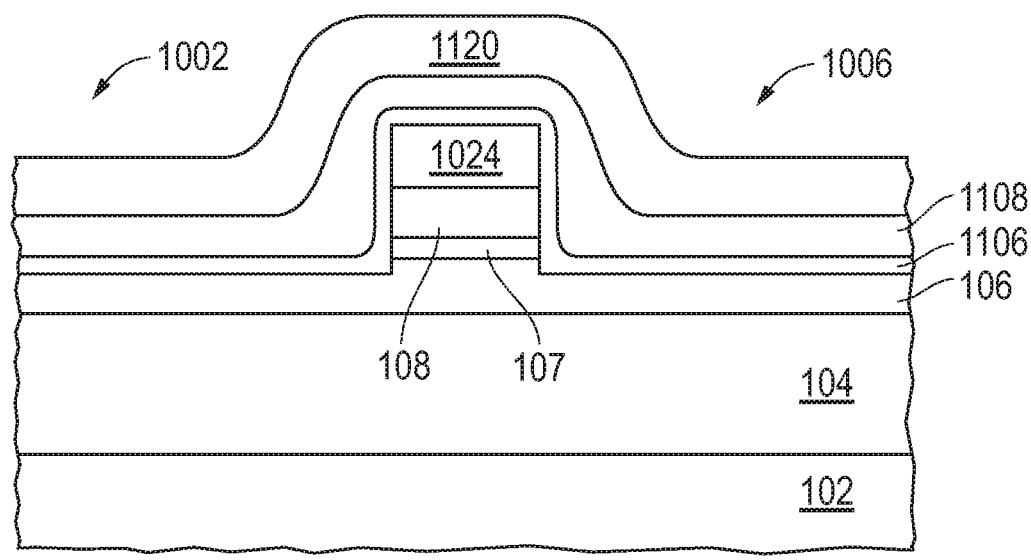
FIG. 11 includes an illustration of a cross-sectional view of the workpiece of FIG. 10 after forming further layers.

Layers 1106, 1108, and 1120 are formed over the exposed portions of the channel layer 106 and the gate electrode 1024, as illustrated in FIG. 11. In another embodiment (not illustrated), a spacer layer can be formed between the layers 1106 and 1108. In an embodiment, the layer 1106 can have any of the compositions as previously described with respect to the channel layer 106, and the layer 1108 can have any of the compositions as previously described with respect to the barrier layer 108. The layer 1106 may have the same or a different composition as compared to the channel layer 106, and the layer 1108 may have the same or a different composition as compared to the barrier layer 108. If a spacer layer is formed between the layers 1106 and 1108, such spacer layer can have any of the compositions as previously described with respect to the spacer layer 107. The layers 1106 and 1108 can help increase the 2DEG and reduce $R_{DSON}$. The layer 1120 is an insulating layer and can have any of the compositions and thicknesses are previously described with respect to the insulating layer 800.

Figure 12:
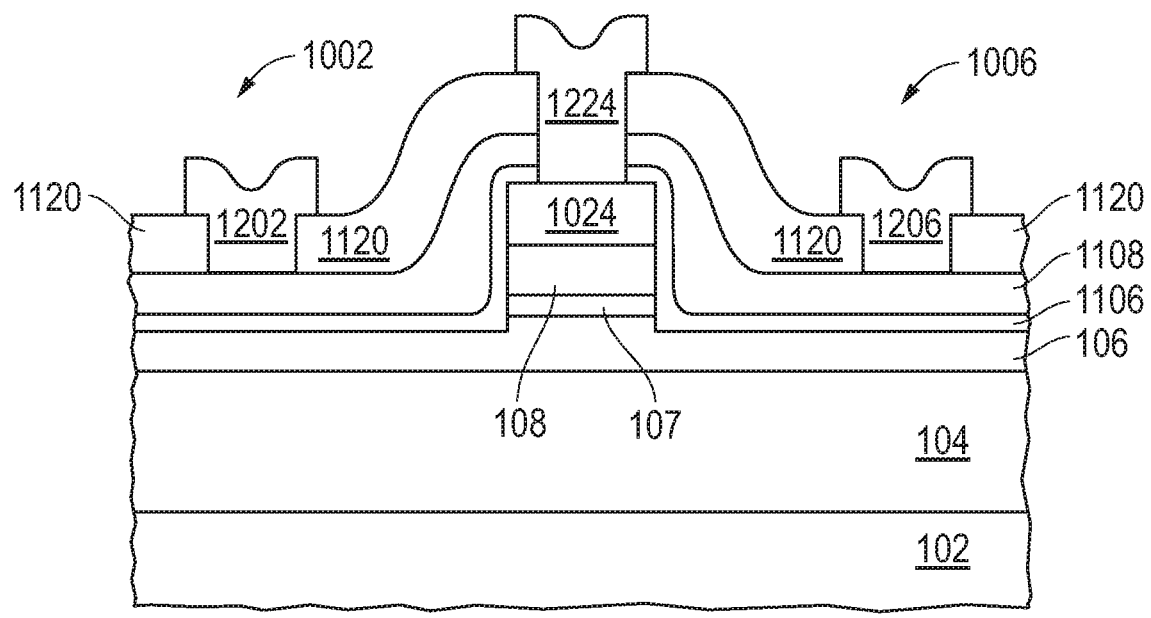
FIG. 12 includes an illustration of a cross-sectional view of the workpiece of FIG. 11 after forming source and drain electrodes and a gate interconnect.

A source electrode 1202, a drain electrode 1206 and a gate interconnect 1224 are formed as illustrated in FIG. 12. The insulating layer 1120 is patterned to form contact openings that expose portions of the layer 1108 and the gate electrode 1024. The patterning of the insulating layer 1120 can be performed using any of the techniques previously described in patterning the insulating layer 800 when defining the contact openings for the source and drain electrodes 802 and 806. An etch used to pattern the contact openings for the source and drain electrodes 1202 and 1206 may land on the layer 1108, may etch part, but not all, of the thickness of the layer 1108, or may etch through the entire thickness of the layer 1108. The insulating layer 800 can be etched to define an opening through the layers 1106, 1108, and 1120 to expose the gate electrode 1024.

A conductive layer is formed over the workpiece and within the contact openings and is patterned to form the source and drain electrodes 1202 and 1206 and the gate interconnect 1224. The composition, thicknesses, and formation sequence(s) of the source and drain electrodes 1202 and 1206 and the gate interconnect 1224 can be any of the compositions, thicknesses, and formation sequences as previously described with respect to the source and drain electrodes 802 and 806 and the gate interconnect 824.

Similar to the previously described embodiments, the contact opening for the gate interconnect 1224 and the contact openings for the source and drain electrodes 1202 and 1206 may be defined using the same process sequence or different process sequences. The gate interconnect 1224 and the source and drain electrodes 1202 and 1206 may be formed using the same process sequence or different process sequences.

Figure 13:
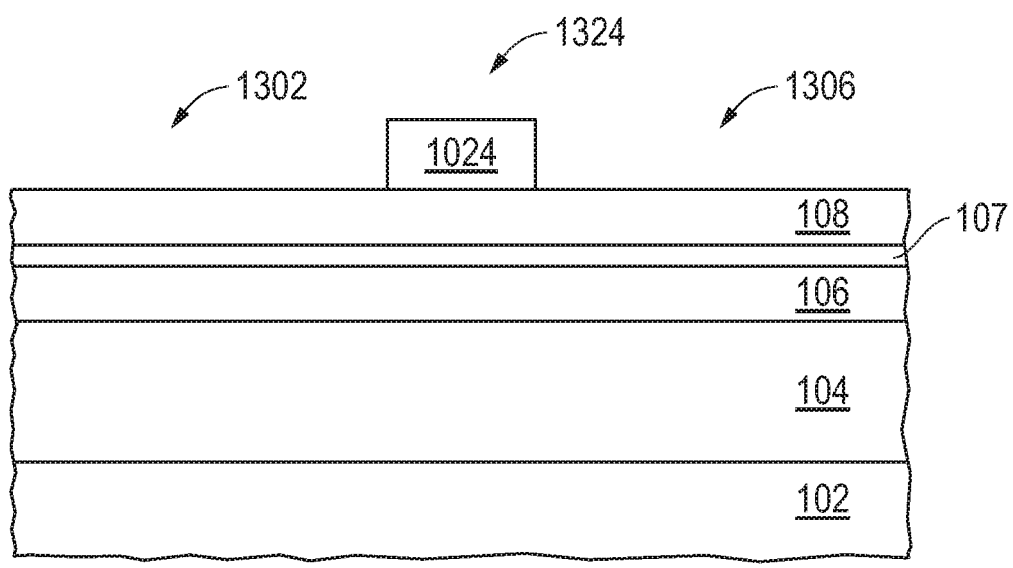
FIG. 13 includes an illustration of a cross-sectional view of a portion of a further workpiece including a substrate and several layers and patterning a gate electrode layer to define a gate electrode.

In a further set of embodiments, a gate electrode can be formed before forming an access region and without etching away portions of a barrier layer before forming an access region. FIG. 13 is similar to FIG. 9 except that the layers 106, 107, and 108 are not patterned. At this point in the process, the barrier layer 108 is exposed within the source and drain regions 1302 and 1306, and the gate electrode 1024 is within the gate region 1324.

Figure 14:
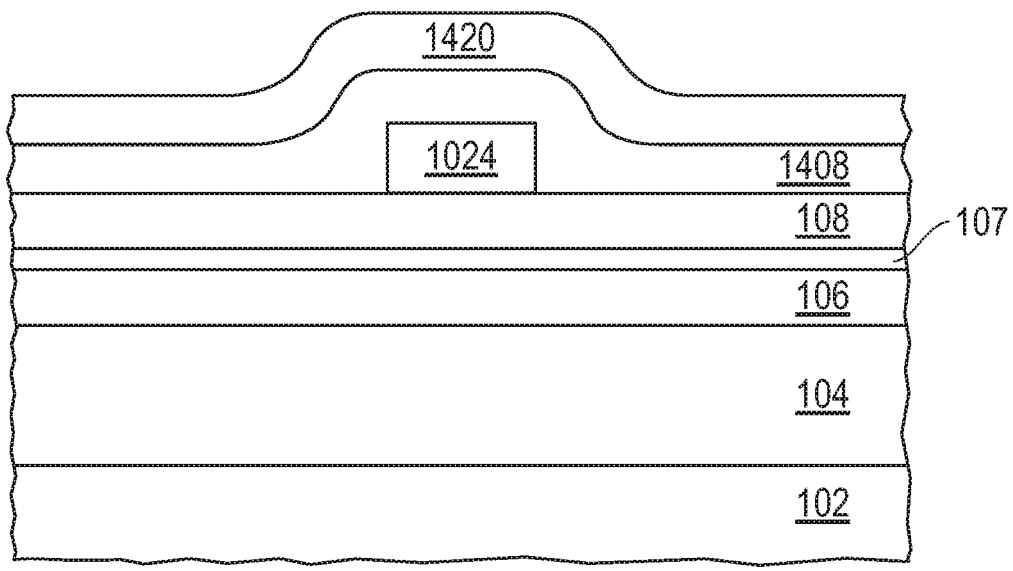
FIG. 14 includes an illustration of a cross-sectional view of the workpiece of FIG. 13 after depositing an access region layer and an insulating layer.

Layers 1408 and 1420 are formed over the workpiece, as illustrated in FIG. 14. The layer 1408 can include any of the compositions and thicknesses as previously described with respect to the layer 1108. The insulating layer 1420 can include any of the compositions and thicknesses as previously described with respect to the insulating layer 800.

Figure 15:
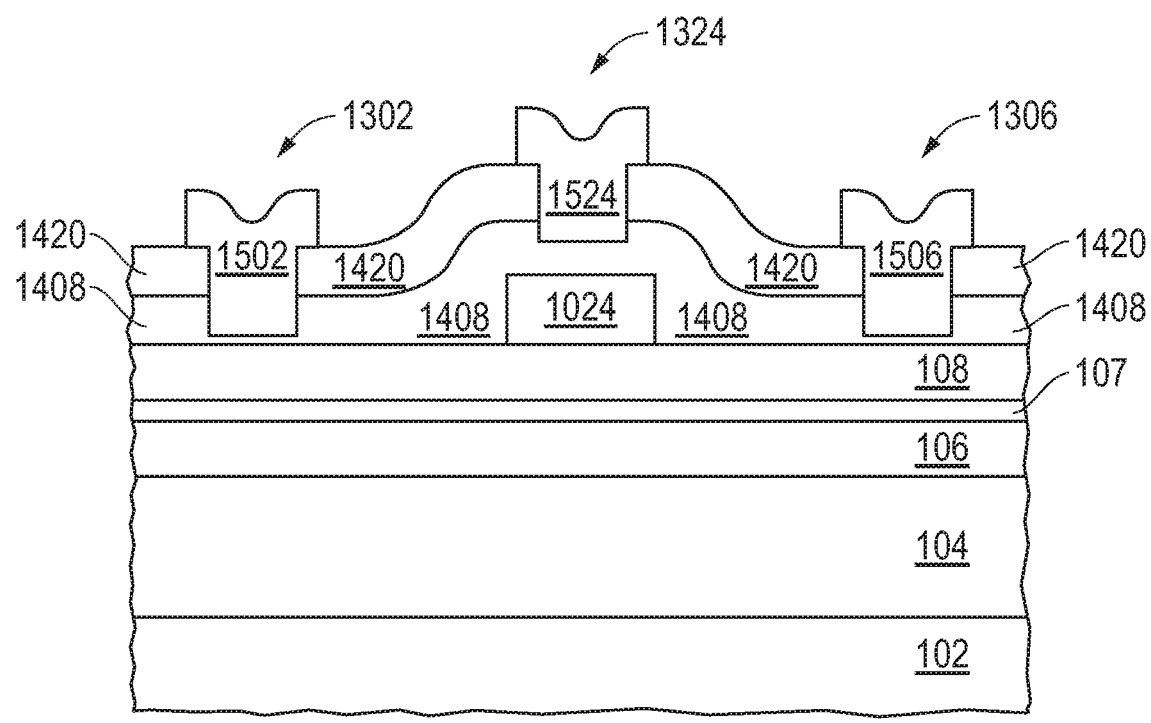
FIG. 15 includes an illustration of a cross-sectional view of the workpiece of FIG. 14 after forming source and drain electrodes and a gate interconnect.

A source electrode 1502, a drain electrode 1506 and a gate interconnect 1524 are formed, as illustrated in FIG. 15. The insulating layer 1420 is patterned to form contact openings that expose portions of the layer 1408. The patterning of the insulating layer 1420 can be performed using any of the techniques previously described in patterning the insulating layer 800 when defining the contact openings for the source and drain electrodes 802 and 806. An etch used to pattern the contact openings for the source and drain electrodes 1502 and 1506 and the gate interconnect 1524 may end on the layer 1408, may etch part, but not all, of the thickness of the layer 1408, or may etch through the entire thickness of the layer 1408. In the embodiment as illustrated, part, but not all, of the thickness of the layer 1408 is etched. Thus, in some embodiments, the gate interconnect 1524 does not need to contact the gate electrode 1024 and still achieve an ohmic contact between the gate interconnect 1524 and the gate electrode 1024. The embodiment can be useful when patterning the contact openings for the source and drain electrodes 1502 and 1506 and the gate interconnect 1524 during the same patterning sequence, as opposed to patterning the contact openings for the source and drain electrodes 1502 and 1506 during a patterning sequence, and patterning the contact opening for the gate interconnect 1524 during a different patterning sequence. With respect to separate patterning sequences, the contact openings for the source and drain electrodes 1502 and 1506 can extend through part, and not all, of the thickness of the layer 1408, and the contact opening within the gate region can extend through an entire thickness of the layer 1408 and expose the gate electrode 1024, so that the gate interconnect 1524 can make physical contact with the gate electrode 1024 (not illustrated).

A conductive layer is formed over the workpiece and within the contact openings and is patterned to form the source and drain electrodes 1502 and 1506 and the gate interconnect 1524. The composition, thicknesses, and formation sequence(s) of the source and drain electrodes 1502 and 1506 and the gate interconnect 1524 can be any of the compositions, thicknesses, and formation sequences as previously described with respect to the source and drain electrodes 802 and 806 and the gate interconnect 824. Similar to the previously described embodiments, the gate interconnect 1524 and the source and drain electrodes 1502 and 1506 may be formed using the same process sequence or different process sequences.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. A substantially completed electronic device has been formed.

Embodiments as described herein can help to maintain a smoother interface between a barrier layer and subsequently grown layers and good carrier mobility under the gate electrode. In some embodiments, no regrowth of a threshold-voltage barrier is needed. More particularly, the threshold voltage of the HEMT will be determined in part by the barrier layer 108 and not the access regions grown over the barrier layer 108. Thus, the threshold voltage can be more uniform within the HEMT. The access region 408 can be engineered with nearly any aluminum content and kept below a critical thickness so that no separate 2DEG is formed between the barrier layer 108 and the access region 408. Furthermore, a desired $R_{DSON}$ can be achieved by thickening the access region 408. The formation of the access region 408 can be performed using a blanket deposition or a selective growth. The process flow can avoid processing steps that are complex or marginal (too little process margin to allow reasonably commercial production levels).

The HEMTs as described herein can be achieved without forming a recess in the channel layer within the gate region. Thus, the HEMT can have improved reliability as compared to a HEMT in which a recess in a channel layer is formed within the gate region. In a particular embodiment, a relatively low aluminum content may be used in the barrier layer 108 to improve the crystal quality under the gate electrode 1024.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

A process of forming an electronic device can include forming a channel layer overlying a substrate; forming a barrier layer overlying the channel layer; forming a p-type semiconductor layer over the barrier layer; patterning the p-type semiconductor layer to define at least part of a gate electrode of a transistor structure; and forming an access region layer over the barrier layer.

Embodiment 2

The process of Embodiment 1, wherein forming the access region layer is performed after patterning the p-type gate electrode.

Embodiment 3

The process of Embodiment 2, wherein forming the access region layer includes selectively growing the access region layer to form an access region adjacent to the gate electrode.

Embodiment 4

The process of Embodiment 2, wherein forming the access region layer includes depositing the access region layer over gate electrode.

Embodiment 5

The process of Embodiment 4, further including removing a portion of the access region layer overlying the gate electrode.

Embodiment 6

The process of Embodiment 1, wherein forming the barrier layer includes forming the barrier layer including $Al_bIn_cGa_{(1-b-c)}N$, wherein $0<b\leq0.1$ and $0\leq c\leq0.1$.

Embodiment 7

The process of Embodiment 1, further including forming a semiconductor layer over the gate electrode, wherein the channel and semiconductor layers have a same semiconductor base material.

Embodiment 8

The process of Embodiment 1, further including removing an exposed portion of the barrier layer that is adjacent to the gate electrode.

Embodiment 9

The process of Embodiment 8, further including recessing a portion of the channel layer adjacent to the gate electrode.

Embodiment 10

The process of Embodiment 9, further including forming a spacer layer such that the spacer layer is disposed between channel layer and the barrier layer or between the barrier layer and the gate electrode.

Embodiment 11

The process of Embodiment 1, further including forming an insulating layer over the access region layer; patterning the insulating and access region layers to define a contact opening over the gate electrode; and forming a gate interconnect within the contact opening.

Embodiment 12

The process of Embodiment 1, further including forming a drain electrode, a source electrode, and a gate interconnect coupled to the gate electrode.

Embodiment 13

The process of Embodiment 12, wherein:
forming the channel layer depositing the channel layer including a GaN layer,
forming the barrier layer includes depositing the barrier layer including $Al_bIn_cGa_{(1-b-c)}N$, wherein $0<b\leq1$ and $0\leq c\leq0.3$,
forming the p-type semiconductor layer includes depositing a p-type GaN layer,
forming the access region layer includes depositing the access region layer including $Al_fIn_gGa_{(1-f-g)}N$, wherein $0<f\leq1$ and $0\leq g\leq0.3$, wherein the access region layer has a same or higher Al content as compared to the barrier layer,
the process further includes:
  forming an insulating layer over the access region layer; and
  patterning the insulating and access region layers to define a contact opening over the gate electrode;
  forming the gate interconnect includes forming the gate interconnect within the contact opening, and
the electronic device includes a high electron mobility transistor.

Embodiment 14

A process of forming an electronic device including:
forming a channel layer overlying a substrate;
  forming a barrier layer overlying the channel layer;
  forming an etch-stop layer over the barrier layer;
  forming a sacrificial layer over the etch-stop layer;
  patterning the etch-stop and etch-stop layers to define a gate region;
  forming an access region layer over the barrier layer after patterning the etch-stop and sacrificial layers; and
  forming a p-type semiconductor layer within the gate region.

Embodiment 15

The process of Embodiment 14, further including removing remaining portions of the etch-stop and sacrificial layers within the gate region after forming the access region layer.

Embodiment 16

The process of Embodiment 15, wherein forming the access region layer includes selectively growing the access region layer after patterning the etch-stop and sacrificial layers.

Embodiment 17

The process of Embodiment 15, wherein:
forming the access region layer includes blanket depositing the access region layer, and
the process further includes removing a portion of the access region layer that is within the gate region before removing remaining portions of the etch-stop and sacrificial layers.

Embodiment 18

The process of Embodiment 15, wherein forming the p-type semiconductor includes depositing the p-type semiconductor layer within the gate region.

Embodiment 19

The process of Embodiment 18, wherein:
depositing the p-type semiconductor layer is performed as a blanket deposition, and
the process further includes removing a portion of the p-type semiconductor layer outside the gate region.

Embodiment 20

The process of Embodiment 14, wherein:
forming the channel layer includes depositing the channel layer including a first GaN layer,
forming the barrier layer includes depositing the barrier layer including $Al_bIn_cGa_{(1-b-c)}N$, wherein $0<b\le1$ and $0\le c\le0.3$,
forming the sacrificial layer includes depositing a second GaN layer, forming the etch-stop layer depositing the etch-stop layer including $Al_dIn_eGa_{(1-d-e)}N$, wherein $0<d\le1$ and $0\le e\le0.3$, and the etch-stop layer has a higher Al content than the barrier layer,
forming the access region layer includes blanket depositing the access region layer including $Al_fIn_gGa_{(1-f-g)}N$, wherein $0<f\le1$ and $0\le g\le0.3$, wherein the access region layer has an Al content between the Al contents of the barrier and etch-stop layers,
the process further includes:
  removing a portion of the access region layer lying within the gate region; and
  removing remaining portions of the etch-stop and sacrificial layers within the gate opening after forming the access region layer,
forming the p-type semiconductor layer includes blanket depositing a p-type GaN layer after removing the remaining portions of the etch-stop and sacrificial layers,
the process further includes removing a portion of the p-type semiconductor layer outside the gate region, and
the electronic device includes a high electron mobility transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   forming a channel layer overlying a substrate;
   forming a barrier layer overlying the channel layer;
   forming a p-type semiconductor layer over the barrier layer;
   patterning the p-type semiconductor layer to define at least part of a gate electrode of a transistor structure;
   forming an access region layer over the barrier layer after patterning the p-type semiconductor layer, wherein the access region layer includes $Al_fIn_gGa_{(1-f-g)}N$, wherein $0<f\le1$ and $0\le g\le0.3$;
   forming a drain electrode such that, within the transistor structure, a bottommost surface of the drain electrode is spaced apart from the barrier layer by at least the access region layer; and
   forming a source electrode such that, within the transistor structure, a bottommost surface of the source electrode is spaced apart from the barrier layer by at least the access region layer.

2. The process of claim 1, wherein forming the access region layer comprises selectively growing the access region layer to form a first access region and a second access region, wherein:
   forming the drain electrode is performed such that the drain electrode contacts the first access region, and
   forming the source electrode is performed such that the source electrode contacts the second access region.

3. The process of claim 1, wherein forming the access region layer comprises depositing the access region layer over gate electrode.

4. The process of claim 3, further comprising removing a portion of the access region layer overlying the gate electrode.

5. The process of claim 1, wherein forming the barrier layer comprises forming the barrier layer including $Al_bIn_cGa_{(1-b-c)}N$, wherein $0<b\le0.1$ and $0\le c\le0.1$.

6. The process of claim 1, further comprising forming a semiconductor layer over the gate electrode, wherein the channel and semiconductor layers have a same semiconductor base material.

7. The process of claim 1, further comprising removing an exposed portion of the barrier layer that is adjacent to the gate electrode.

8. The process of claim 7, further comprising recessing a portion of the channel layer adjacent to the gate electrode.

9. The process of claim 1, further comprising:
forming an insulating layer over the access region layer;
patterning the insulating and access region layers to define a contact opening over the gate electrode; and
forming a gate interconnect within the contact opening.

10. The process of claim 1, wherein:
forming the drain electrode is performed such that the drain electrode contacts the access region layer,
forming the source electrode is performed such that the drain electrode contacts the access region layer, and
the process further comprises forming a gate interconnect coupled to the gate electrode.

11. The process of claim 10, wherein:
forming the channel layer comprises depositing the channel layer including a GaN layer,
forming the barrier layer comprises depositing the barrier layer including $Al_b In_c Ga_{(1-b-c)}N$, wherein $0<b\le 1$ and $0\le c\le 0.3$,
forming the p-type semiconductor layer comprises depositing a p-type GaN layer,
forming the access region layer is performed such that the access region layer has a same or higher Al content as compared to the barrier layer,
the process further comprises:
forming an insulating layer over the access region layer; and
patterning the insulating and access region layers to define a contact opening over the gate electrode;
forming the gate interconnect comprises forming the gate interconnect within the contact opening, and
the electronic device includes a high electron mobility transistor.

12. A process of forming an electronic device comprising:
forming a channel layer overlying a substrate;
forming a spacer layer overlying a substrate;
forming a barrier layer overlying the channel layer;
forming a p-type semiconductor layer over the barrier layer;
patterning the p-type semiconductor layer to define at least part of a gate electrode of a transistor structure;
forming an access region layer over the barrier layer after patterning the p-type semiconductor layer, wherein the access region layer includes $Al_f In_g Ga_{(1-f-g)}N$, wherein $0<f\le 1$ and $0\le g\le 0.3$;
forming a drain electrode spaced apart from the barrier layer by at least the access region layer; and
forming a source electrode spaced apart from the barrier layer by at least the access region layer,
wherein the spacer layer is disposed between the channel layer and the barrier layer or between the barrier layer and the gate electrode.

13. A process of forming an electronic device comprising:
forming a channel layer overlying a substrate;
forming a barrier layer overlying the channel layer;
forming an etch-stop layer over the barrier layer;
forming a sacrificial layer over the etch-stop layer;
patterning the etch-stop and sacrificial layers to define a gate region;
forming an access region layer over the barrier layer after patterning the etch-stop and sacrificial layers;
removing remaining portions of the etch-stop and sacrificial layers within the gate region after forming the access region layer; and
forming a p-type semiconductor layer within the gate region.

14. The process of claim 13, wherein forming the access region layer comprises selectively growing the access region layer after patterning the etch-stop and sacrificial layers.

15. The process of claim 13, wherein:
forming the access region layer comprises blanket depositing the access region layer, and
the process further comprises removing a portion of the access region layer that is within the gate region before removing remaining portions of the etch-stop and sacrificial layers.

16. The process of claim 13, wherein forming the p-type semiconductor layer comprises depositing the p-type semiconductor layer within the gate region.

17. The process of claim 16, wherein:
depositing the p-type semiconductor layer is performed as a blanket deposition, and
the process further comprises removing a portion of the p-type semiconductor layer outside the gate region.

18. The process of claim 13, wherein:
forming the channel layer comprises depositing the channel layer including a first GaN layer,
forming the barrier layer comprises depositing the barrier layer including $Al_b In_c Ga_{(1-b-c)}N$, wherein $0<b\le 1$ and $0\le c\le 0.3$,
forming the sacrificial layer comprises depositing a second GaN layer,
forming the etch-stop layer depositing the etch-stop layer including $Al_d In_e Ga_{(1-d-e)}N$, wherein $0<d\le 1$ and $0\le e\le 0.3$, and the etch-stop layer has a higher Al content than the barrier layer,
forming the access region layer comprises blanket depositing the access region layer including $Al_f In_g Ga_{(1-f-g)}N$, wherein $0<f\le 1$ and $0\le g\le 0.3$, wherein the access region layer has an Al content between the Al contents of the barrier and etch-stop layers,
the process further comprises removing a portion of the access region layer lying within the gate region,
forming the p-type semiconductor layer comprises blanket depositing a p-type GaN layer after removing the remaining portions of the etch-stop and sacrificial layers,
the process further comprises removing a portion of the p-type semiconductor layer outside the gate region, and
the electronic device includes a high electron mobility transistor.

19. The process of claim 13, wherein the access region layer includes $Al_f In_g Ga_{(1-f-g)}N$, wherein $0<f\le 1$ and $0\le g\le 0.3$.

20. The process of claim 13, further comprising:
forming a drain electrode that contacts a first portion of the access region layer;
forming a source electrode that contacts a second portion of the access region layer, wherein the gate region is disposed between the first and second portions of the access region layer; and
forming a gate interconnect coupled to the gate electrode.

* * * * *